(12) United States Patent
Roethig

(10) Patent No.: US 7,724,860 B2
(45) Date of Patent: May 25, 2010

(54) AUTO-ADAPTIVE DIGITAL PHASE-LOCKED LOOP FOR LARGE FREQUENCY MULTIPLICATION FACTORS

(75) Inventor: Wolfgang Roethig, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 909 days.

(21) Appl. No.: 11/277,705

(22) Filed: Mar. 28, 2006

(65) Prior Publication Data

US 2007/0230650 A1    Oct. 4, 2007

(51) Int. Cl.
   *H03D 3/24* (2006.01)
(52) U.S. Cl. .................................... 375/376
(58) Field of Classification Search ......... 375/354–355, 375/371, 373, 376
   See application file for complete search history.

(56) References Cited

U.S. PATENT DOCUMENTS

| | | | | |
|---|---|---|---|---|
| 4,583,211 A | * | 4/1986 | Nishikawa et al. | ......... 369/59.1 |
| 5,594,763 A | * | 1/1997 | Nimishakavi | ................ 375/376 |
| 6,686,803 B1 | * | 2/2004 | Perrott et al. | .................. 331/10 |
| 2005/0078783 A1 | * | 4/2005 | Okita | ........................... 375/376 |
| 2006/0045215 A1 | * | 3/2006 | Ballantyne et al. | ........... 375/344 |
| 2006/0245532 A1 | * | 11/2006 | Ziesler | ........................ 375/376 |

* cited by examiner

*Primary Examiner*—Khanh C Tran
(74) *Attorney, Agent, or Firm*—Panitch Schwarze, et al.

(57) ABSTRACT

An auto-adaptive digital phase locked loop (DPLL) includes a phase detector comprising an edge detector having an input that receives an input clock, and an output that outputs a reference event generated from a reference edge of the input clock. The DPLL also includes a programmable first counter that counts down at the generated clock rate, the first counter having a first input that is programmed with an integer value M, a second input that receives the generated clock, and an output that outputs a counter state based on the generated clock and the integer value M. A first register has a first input that receives the reference event, a second input that receives the counter state, and an output that outputs a sample value N(t), wherein the register stores the counter state as the sampled value N(t) that represents a code for a phase between the reference event and the counter state.

11 Claims, 2 Drawing Sheets

AUTO-ADAPTIVE DIGITAL PHASE-LOCKED LOOP FOR LARGE FREQUENCY MULTIPLICATION FACTORS

BACKGROUND OF THE INVENTION

The present invention is directed to a digital phase-locked loop (DPLL), and more particularly, to an auto-adaptive DPLL for large frequency multiplication factors.

Existing designs for a phase locked-loop use either an analog (i.e., APLL) architecture or a DPLL architecture. An APLL requires custom design and careful tuning of all analog components in the design in order to perform its function accurately. Two crucial components of an APLL are a voltage-controlled oscillator (VCO) and a low-pass filter. It is difficult for an APLL to simultaneously achieve highly stable operation with a fast locking time because these two design requirements conflict with each other. The low-pass filter requires that the bandwidth be narrow enough to reject any high-frequency noise, but also be wide enough to meet the desired locking time requirements at a desired generated clock frequency. For applications that operate over a wide range of frequencies, programmable tuning parameters are provided in the APLL to control the functioning of the design. Requirements for tuning the APLL parameters make the overall design more complex and costly to produce, and make each application more complicated to implement.

Existing DPLL designs typically perform frequency synthesis using a numerically controlled oscillator (NCO). The NCO relies on an accurately controlled delay line and an external crystal reference oscillator. Some implementations of existing DPLL designs can also use an analog to digital (i.e., A/D) converter for generating a sinusoidal clock waveform. Therefore, even a conventional DPLL may have a significant number of analog components associated with its architecture, which requires a similar design effort as required for the components of an APLL.

The present invention is directed to an auto-adaptive DPLL for large frequency multiplication factors and a method for producing a generated clock frequency output that avoids one or more problems resulting from the limitations and disadvantages of the prior art APLL and DPLL designs.

The auto-adaptive DPLL generates a clock frequency based on an input reference clock frequency, the generated clock frequency being a large integer multiple (e.g., greater than 100) of the input reference clock frequency.

A typical application for the auto-adaptive DPLL is in a high definition television (HDTV) or a standard definition television (SDTV) pixel clock generator, which is based on a horizontal synchronization signal. The reference frequency is in the range of 10 kHz to 100 kHz with the generated pixel clock frequency in the range from about 20 MHz to 200 MHz. The frequency multiplication factor in this application is typically in the range from about 858 to 2200, but the factor and range may be different for other applications. Some of the requirements for the pixel clock include a very highly stable operation and a very fast locking time over a wide range of reference frequencies and frequency multiplication factors, as defined by various HDTV and SDTV standards.

BRIEF SUMMARY OF THE INVENTION

In accordance with one embodiment of the present invention there is provided an auto-adaptive digital phase locked loop (DPLL) including a phase detector, the phase detector comprising an edge detector having an input that receives an input clock, and an output that outputs a reference event generated from a reference edge of the input clock. A programmable first counter counts down at a generated clock rate, the programmable first counter having a first input that is programmed with an integer value M, a second input that receives a generated clock, and an output that outputs a counter state based on the generated clock and the integer value M. The phase detector further comprises a first register having a first input that receives the reference event, a second input that receives the counter state, and an output that outputs a sample value N(t), wherein the first register stores the counter state as the sampled value N(t) that represents a code for a phase between the reference event and the counter state.

In accordance with another embodiment, the present invention comprises a method of producing a generated clock frequency output for a digital phase-locked loop (DPLL) the method comprising: inputting an input clock signal into a first input of an edge detector of a phase detector circuit that generates an output reference event; programming a first counter of the phase detector into a first counter input with an integer value M and inputting the generated clock into a second input of the first counter of the phase detector that outputs a counter state; inputting the reference event into a first input and inputting the counter state into a second input of a first register of the phase detector circuit that outputs a sampled code N(t), where t denotes time normalized to the period of the reference event $T_{ref}$ (t=time/$T_{ref}$); inputting the generated clock into a second counter of a parameter acquisition circuit that counts down and outputs a measured value $N_1$ at a predetermined interval; inputting the reference event and the measured value $N_1$ into a second register of the parameter acquisition circuit for storage and outputting the measured value $N_1$ as needed; inputting a calculated transfer function L(N) and the reference event into a third register of the parameter acquisition circuit for storage and outputting the set value $L_1$ as needed; inputting the sampled code N(t) into a first input, inputting the measured value $N_1$ into a second input, and inputting the set value $L_1$ into a third input of a transcoder that outputs a calculated transfer function L(N) to a first multiplexer of an oscillator transfer function circuit; inputting the transfer function L(N) into a first input and inputting a reference phase signal $\Phi_{ref}$ into a second input of an oscillator output control for outputting a phase select signal; inputting a plurality of K phase signals $\Phi_K$ generated by a free-running K-phase oscillator into a first input and inputting the phase select signal into a second input of a multiplexer of a frequency synthesizer circuit; and selecting and outputting a phase signal $\Phi_i$ from the plurality of K phase signals $\Phi_K$ by the multiplexer of the frequency synthesizer circuit from the K-phase oscillator by using the phase select signal generated by the oscillator output control circuit that is inputted into the multiplexer, wherein $\Phi_i$ is the generated clock frequency.

The present invention in yet another embodiment comprises an auto-adaptive digital phase locked loop (DPLL) including a frequency synthesizer for outputting a generated clock, the frequency synthesizer comprising: (a) a K-phase oscillator having a first output that outputs a phase reference $\Phi_{ref}$ signal, and a plurality of K second outputs that output K phase signals $\Phi_K$, where K is a positive integer that is greater than one; (b) an oscillator output control circuit having a first input that receives a transcoder transfer function L(N), a second input that receives the phase reference $\Phi_{ref}$ signal, and an output that outputs a phase select signal; and c) a multiplexer having a first input that receives the phase select signal, a second input that receives the K phase signals $\Phi_K$, and an output that outputs the generated clock according to the phase select signal.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
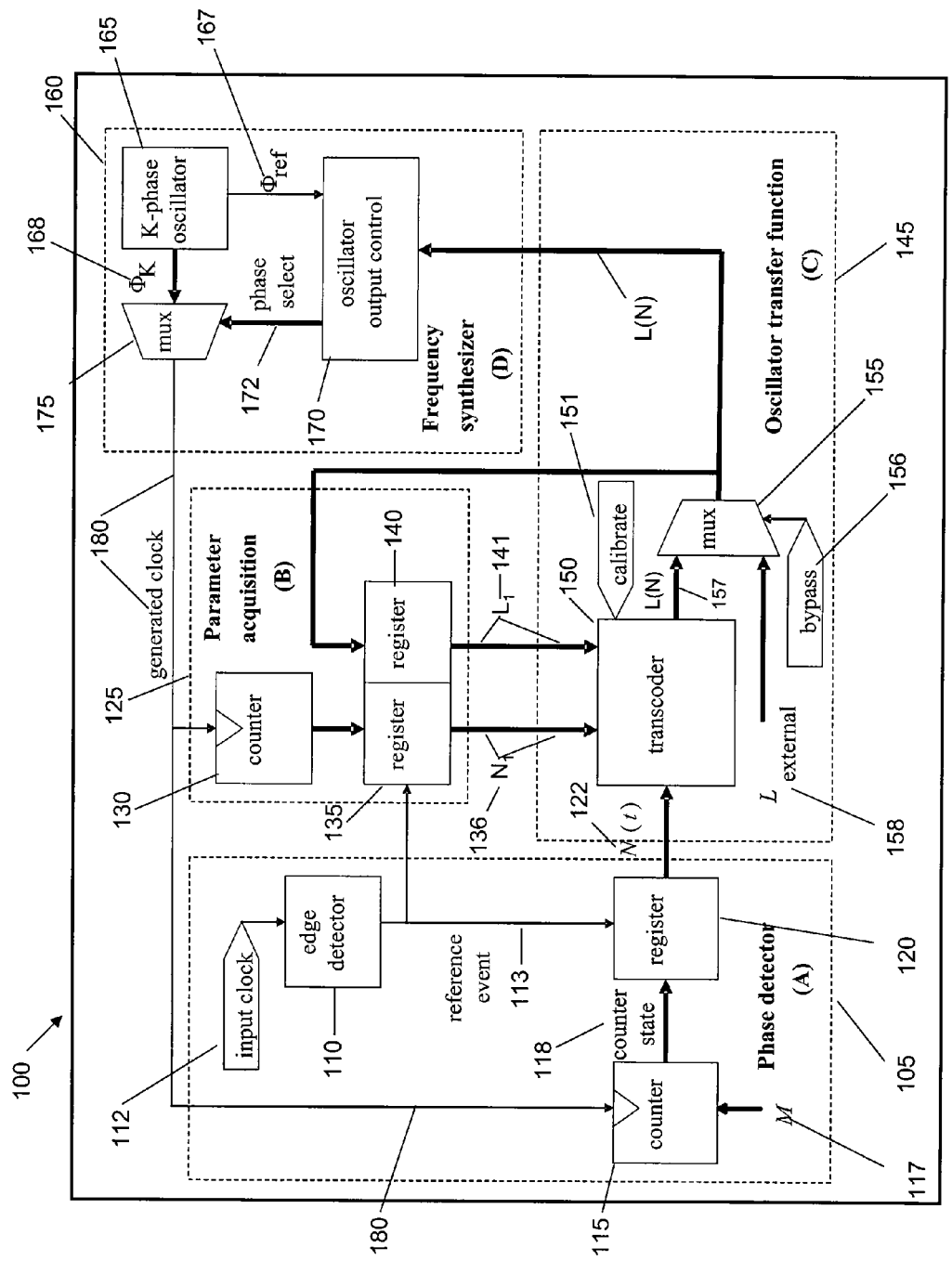
FIG. 1 is a functional schematic block diagram of a functional hierarchy for a DPLL according to a preferred embodiment of the present invention.

FIG. 1 is functional schematic block diagram of a functional hierarchy for a digital phase-locked loop (DPLL) 100 in accordance with a preferred embodiment of the present invention. Referring to FIG. 1, the DPLL 100 includes a frequency synthesizer circuit or subassembly 160 for outputting a generated output clock signal or clock 180. The frequency synthesizer 160 comprises a K-phase oscillator 165 that has a first output for outputting a phase reference $\Phi_{ref}$ signal 167, and a plurality of K second outputs for outputting a plurality of K phase signals $\Phi_K$ 168, where K is a positive integer that is greater than one. The K-phase oscillator 165 preferably includes a fixed divider with the K value that is a power of 2 (e.g., $2^x$, where x=1, 2, 3, ...) for defining the K phase signals 168. An oscillator output control circuit 170 has a first input for receiving a calculated transcoder function L(N) 157 from a source that will hereinafter be described, a second input for receiving the phase reference $\Phi_{ref}$ signal 167 from the K-phase oscillator 165, and an output for outputting a phase select signal 172 to a multiplexer (mux) 175. The multiplexer 175 has a first input for receiving the phase select signal 172 from the oscillator output control 170, a second input for receiving the phase signals $\Phi_K$ 168 from the K-phase oscillator 165, and an output for outputting the generated clock 180 according to the received phase select signal 172 and the received phase signals $\Phi_K$ 168. The generated clock 180 is scalable to an arbitrary frequency range and locks as will be hereinafter described to within a single reference event period ($T_{ref}$).

Referring again to FIG. 1, the DPLL 100 further includes a phase detector circuit or subassembly 105 that comprises an edge detector 110, which has an input for receiving a clock signal from an input clock 112 and an output for outputting an output or reference event 113 which is generated by the edge detector 110 when a reference edge of an input clock signal is received from the input clock 112. The clock signal from the input clock 112 has at least one selectable reference edge which may be selected to be a rising edge, a falling edge or both the rising and the falling edges and this is the event to which the DPLL 100 is locked. A programmable first counter 115 that has a first programming input for programming the first counter 115 with an integer value M 117 and receives the generated clock 180 from the multiplexer 175. The first counter 115 functions to count down at M times the generated clock 180 rate and includes an output for outputting a counter state 118 based on the generated clock 180 and the integer value M 117. Typically the integer value M 117 ranges from about 100 to about 5,000, however the upper bound for the integer value M is theoretically unlimited and the lower bound is given by a required accuracy according to a phase resolution=360 degrees/M. For example, if the phase is required to be accurate to a resolution of 1 degree, M must be 360 or greater. By programming the first counter 115 with the integer value M, the states of the first counter 115 are repeated periodically after every M generated clock cycles. A first register 120 has a first input for receiving the reference event 113 from the edge detector 110, and a second input for receiving the counter state 118 from the first counter 115. The first register 120 periodically samples the received counter state 118 by the reference event 113 at the input clock rate and stores the results. The stored sampled value N(t) 122, which represents a code for the phase between the reference event 113 and the counter state 118 is outputted by the first register 120.

Referring again to FIG. 1, the DPLL 100 further comprises a parameter acquisition circuit or subassembly 125 that includes a second counter 130, which has an input for receiving the generated clock 180 from the multiplexer 175 and an output for outputting a measured value. A second register 135 has a first input for receiving the measured value from the second counter 130 and a second input for receiving the reference event 113 from the edge detector 110. The second register 135 samples the received measured value from the second counter 130 by the reference event 113 at the clock rate and stores the result as measured value $N_1$ 136. The second register 135 outputs the sampled measured value $N_1$ 136 at predetermined intervals as needed. Finally, a third register 140 has a first input for receiving a calculated transfer function L(N) and a second input for receiving the reference event 113 from the edge detector 110. The third register 140 samples the received transfer function L(N) by the reference event 113 at the clock rate and stores the result as set value $L_1$ 141. The third register 140 has an output for outputting the set value $L_1$ 141 at predetermined intervals as needed.

The DPLL 100 further comprises an oscillator transfer function circuit or subassembly 145 that includes a transcoder 150 and a multiplexer (mux) 155. The transcoder 150 has a first input for receiving the sampled value N(t) 122 from the first register 120, a second input for receiving the measured value $N_1$ 136 from the second register 135, a third input for receiving the set value $L_1$ 141 from the third register 140 and a fourth input for receiving a calibrate signal from a calibrator 151. In this manner, the transcoder 150 is updated with the measured value $N_1$ 136 and the set value $L_1$ 141 as needed. The transcoder uses the inputs to generate a calculated transfer function L(N) 157 which is outputted to the multiplexer 155. The multiplexer 155 has a first input for receiving the outputted calculated transfer function L(N) 157 from the transcoder 150, a second input for receiving an external set value $L_{external}$ 158, a third input for receiving a bypass signal from a bypass signal generator 156, which is used to select either the transcoder transfer function L(N) 157 or the external set value $L_{external}$ 158. The multiplexer 155 provides an output, which comprises either the transcoder transfer function L(N) 157 or the external set value $L_{external}$ 158 as needed. The output from the multiplexer 155 is provided as a first input to the oscillator output control circuit 170 as described above.

Figure 2:
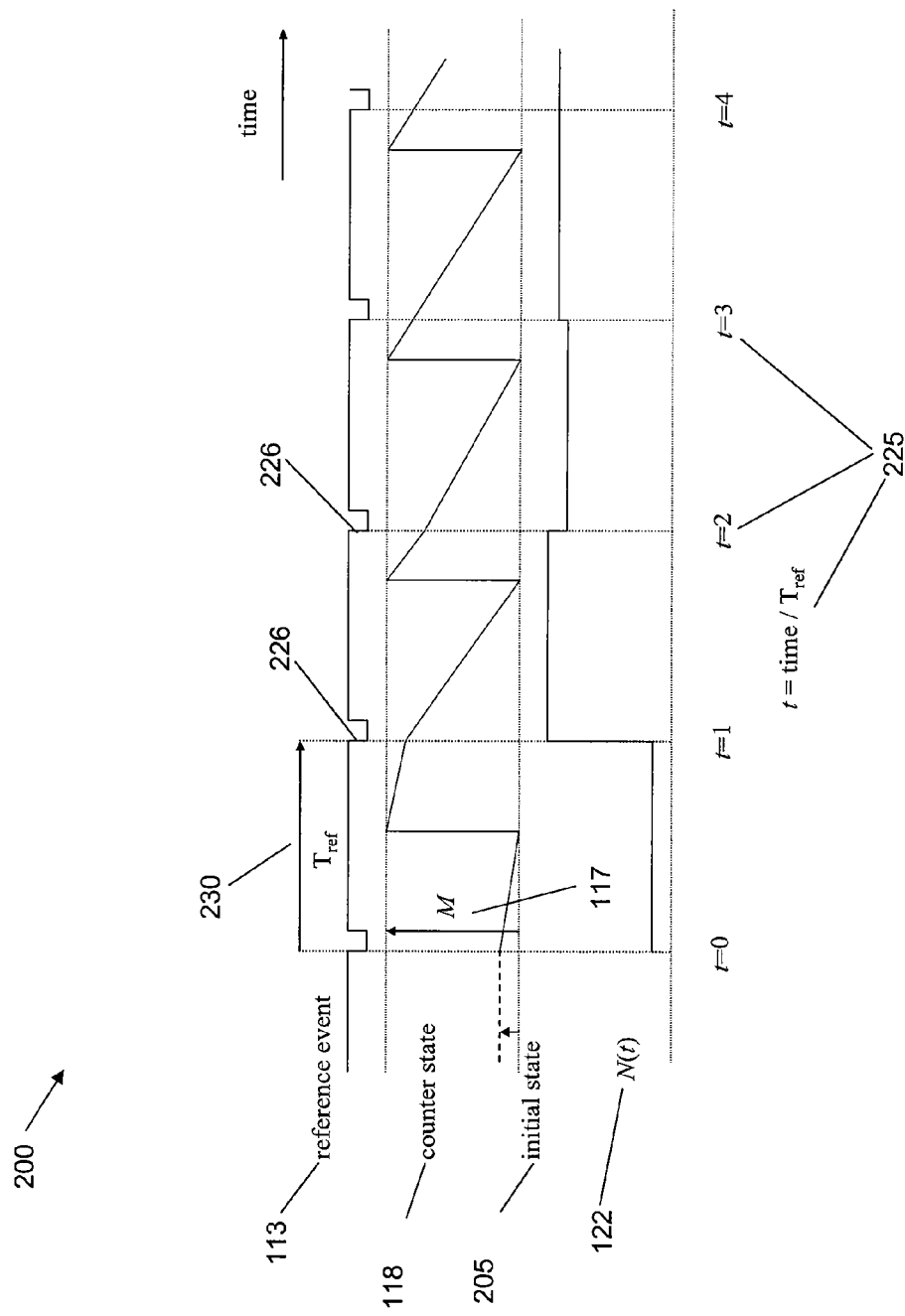
FIG. 2 is a timing diagram for waveforms at selected locations of the embodiment of FIG. 1.

FIG. 2 is a timing diagram 200 illustrating some waveforms for the operation of the DPLL 100 in accordance with a preferred embodiment of the present invention. The waveforms show how the reference event 113 synchronizes the first counter state 118 from an initial state 205 to N(t) 122 for a normalized time scale t=time/$T_{ref}$ 225.

All of the waveforms of FIG. 2 are referenced to the bottom horizontal axis, which represents discrete time intervals t 225 that are normalized to a ratio of actual time versus reference event 230 time (i.e., time/$T_{ref}$). The reference event time, $T_{ref}$ 230 is a time period between reference events taken between a rising edge, falling edge or both a rising and falling edge of two reference events. For this example, the falling edge 226 is as shown on the reference event waveform 113 in FIG. 2. The reference event 113 waveform is the output reference event 113 of the edge detector 110 of the phase detector subassembly 105 in FIG. 1, and this is the event or waveform that the DPLL 100 becomes synchronized to under a stable operating condition. To obtain a stable and synchronized operation, the counter state 118 begins with an initial state 205, then a multiplication factor M 117 is applied to the counter state 118 causing the output of the programmable first counter 115 to increase its magnitude. Once the counter state 118 reaches its maximum value, it begins to count down to a minimum value. When the counter state 118 is at the minimum value, the multiplication factor M 117 is again applied to the counter state 118 and this procedure is continuously repeated to form the illustrated waveform, which generally resembles a saw-tooth waveform or shape and is used to ensure and maintain a synchronized and stable operation for the DPLL 100. The saw-tooth waveform of the counter state 118 is applied to the input of the first register 120 of the phase detector 105, and together with the reference event 113 that is applied to the second input of the first register 120, samples and stores a sampled value N(t) 122. Referring again to FIG. 2, the sampled value N(t) 122 initially starts at a minimum, then after the counter state 118 changes from its initial state 205 to a maximum value, the sampled value N(t) changes to a maximum value when the next reference edge 226 occurs. While the counter state 118 continuously changes between the minimum and maximum values (e.g., the saw-tooth waveform), the sampled value N(t) 122 adjusts its maximum value only at subsequent reference edges 226 until the sampled value N(t) 122 stabilizes. The sampled value N(t) 122 is then applied to an input of the transcoder 150, which is used to convert a code word L to a transfer function L(N) for the transcoder 150 by using the sampled value N(t) 122, the measured value $N_1$ 136 and the set value $L_1$ 141, for synchronizing the generated clock of the DPLL 100 to a desired selected frequency.

Further in accordance with the present invention, there is provided a method of producing a generated clock frequency output for a digital phase locked loop that comprises inputting an input clock signal 112 into a first input of an edge detector 110 of a phase detector circuit 105, which generates an output reference event 113. Programming a first counter 115 with an integer value M 117 via a first input and inputting the generated clock 180 into a second input of the first counter 115 of the phase detector circuit 105 for outputting a counter state 118. Inputting the reference event 113 into a first input of a first register 120 and inputting the counter state 118 into a second input of the first register 120 of the phase detector circuit 105 for outputting a sampled code N(t) 122. Inputting the generated clock 180 into an input of a second counter 130 of a parameter acquisition circuit 125, which counts down and outputs a measured value $N_1$ 136 at a predetermined interval and inputting the reference event 113 and the measured value $N_1$ into a second register 135 of the parameter acquisition circuit 125 for storing and outputting a measured value $N_1$ 136 from the second register 135. Next, inputting a transfer function L(N) and the reference event into a third register 140 of the parameter acquisition circuit 125 for outputting the set value $L_1$ 141 as needed. Inputting the sampled value N(t) 122 into a first input, inputting the measured value $N_1$ 136 into a second input, and inputting the set value $L_1$ 141 into a third input of a transcoder 150, which outputs a transfer function L(N) 157 to a first multiplexer 155 of an oscillator transfer function circuit 145. Inputting the transfer function L(N) 157 into a first input and inputting a reference phase signal $\Phi_{ref}$ 167 into a second input of an oscillator output control circuit 170, which outputs a phase select signal 172 to a multiplexer 175. Inputting a plurality of K phase signals $\Phi_K$ 168 that is generated by a free-running K-phase oscillator 165 into a first input of the multiplexer 175 of the frequency synthesizer circuit 160. Selecting and outputting a phase signal $\Phi_i$ from the plurality of K phase signals $\Phi_K$ 168 by the multiplexer 175 of the frequency synthesizer circuit 160 from the K-phase oscillator 165 by using the phase select signal 172 generated by the oscillator output control circuit 170, which is inputted into the multiplexer 175, and wherein $\Phi_i$ is the generated clock frequency 180.

DETAILED OPERATION DESCRIPTION

Referring to FIGS. 1 and 2, the edge detector 110 generates a reference event 113, when the reference edge of an input clock 112 arrives at the edge detector 110. The reference edge (i.e., rising, falling or both) of the reference event 113 is a point at which the generated clock 180 of the DPLL 100 will be locked. In general, the input clock 112 may have a variable duty cycle, such that only one edge is repeated periodically and the other edge is modulated in time, and therefore the periodical edge is chosen as reference edge. For example, in one application a composite video synchronization signal is an example for an input clock with one periodical edge and one time-modulated edge.

The programmable first counter 115 counts down at the rate of the generated clock 180 of the DPLL 100, wherein the rate of the generated clock 180 is exactly M 117 times the rate of the input clock and M 117 is a positive integer multiplication factor that is typically in the range from about 100 to about 5,000 and the range may be different for other applications. Since the programmable first counter 115 is programmed with the integer value M 117, the counter state 118 is repeated periodically after every M 117 generated clock 180 cycles.

Following is a detailed description of the operation for a preferred embodiment of the DPLL 100 and the following notations are used:

$T_{ref}$ Period of the reference event, also called reference clock period $f_{ref}$ Frequency of the reference event, also called input clock rate, where $f_{ref}=1/T_{ref}$ $T_{gen}$ Period of the generated clock, also called generated clock period $f_{gen}$ Frequency of the generated clock, also called output clock rate, where $f_{gen}=1/T_{gen}$ t time normalized to the reference clock period, (i.e., t=time/$T_{ref}$)

Therefore, the generated clock 180 of DPLL 100 has its frequency expressed by the following equation:

$f_{gen}=M*f_{ref}$, as defined above.

And a referenced clock period or reference event 113 is expressed by the following equation:

$T_{ref}=M*T_{gen}$, as defined above.

The counter state 118 that is outputted by the first programmable counter 115 is periodically sampled by the reference event 113 at the input clock 112 rate and stored in the first register 120. The stored value N(t) 122 represents a code or value for a phase between the periodical reference event 113 and the periodical countdown of the counter 115 (i.e., counter state 118). The DPLL 100 is stable and locked to the input clock 112 if N(t) 122 remains constant (i.e., equals N) and hence independent of the normalized time t 225.

The oscillator transfer function subassembly 145 and the frequency synthesizer subassembly 160 develop a generated clock 180 with a frequency $f_{gen}$, which is proportional to the phase code N(t) 122 that is stored in the first register 120. The generated clock 180 frequency $f_{gen}$ can only change its frequency at discrete normalized time intervals t 225, when the counter state 118 is sampled by the reference event 113 of the edge detector 110. Therefore, the sampled phase N(t) 122 that is stored in register 120 is used to control the frequency of the oscillator 165 according to the following equation:

$$f_{gen} = G_{osc} N(t) \quad [1],$$

where $G_{osc}$ is the gain of the oscillator.

The phase at a sampling instant N(t+1) is related to the phase at the previous sampling instant N(t) as follows:

$$N(t+1) = N(t) + M - N_1(t), \text{ where} \quad [2],$$

$$N_1(t) = f_{gen}(t) T_{ref} \quad [3],$$

is a clock cycle count during the time interval $T_{ref}$.

By combining equations [1]-[3], the following equation is produced:

$$N(t+1) = M + N(t)(1 - G_{osc} T_{ref}) \quad [4].$$

In a stable operation mode, N is a constant and independent of t, therefore an actual clock cycle count $N_1(t)$ is equal to M 117, as desired. Combining N(t+1)=N(t) with equation [4], the following equation is produced:

$$N = \frac{M}{G_{osc} T_{ref}}. \quad [5]$$

For dynamic stability of the DPLL 100, a Z-transform of equation is considered as follows:

$$\mathcal{J}(N(k+1) - N(k)(1 - G_{osc} T_{ref})) = \mathcal{J}(M)$$

$$\mathcal{J}(N)(z - (1 - G_{osc} T_{ref})) = \mathcal{J}(M)$$

$$\frac{\mathcal{J}(N)}{\mathcal{J}(M)} = \frac{1}{z - (1 - G_{osc} T_{ref})}$$

This is a first-order transfer function and its characteristic equation is defined as follows:

$$z - (1 - G_{osc} T_{ref}) = 0$$

and which has a pole that exists at $$z = 1 - G_{osc} T_{ref} \quad [6].$$

To ensure the DPLL 100 maintain its stability, the pole must be located inside a unit circle that is defined by the following boundary:

$$-1 < z < 1 \text{ or } -1 < (1 - G_{osc} T_{ref}) < 1$$

The DPLL 100 is optimally stable under the following condition:

$$z = 0 \text{ or } G_{osc} T_{ref} = 1 \text{ or } N = M \quad [7],$$

that is, when z=0, it implies that $G_{osc} T_{ref} = 1$ or the value of N is the same for M and thus, the DPLL 100 is optimally stable during its operation.

When the gain $G_{osc}$ is set to an optimal value satisfying $G_{osc} T_{ref} = 1$ according to equation [7], the phase code N(t+1) will be equal to the frequency multiplier M 117 and independent of its previous value N(t) 122 according to equation [4]. Furthermore, the initial value of N can be set to a desired value so that it is equal to the frequency multiplier M 117. Thus the DPLL 100 locks within a single reference clock (i.e., input clock 112) period $T_{ref}$.

For the frequency synthesizer 160, a desired frequency with a time resolution $T_{delay}$ can be digitally generated by using a free-running single-phase oscillator (not shown) that is running at a frequency $1/T_{delay}$ with a programmable frequency divider (not shown) that is programmed to a code word L. The code word L represents time that is normalized to discrete increments of $T_{delay}$. On the other hand, one preferred embodiment uses the K-phase oscillator 165 with a fixed divider K, where K is a power of 2 (i.e., $K=2^x$ for $x \geq 0$), such as $K=2^4=16$. The fixed divider generates K phase signals $\Phi_i$, where $1 \leq i \leq K$, and a reference phase signal $\Phi_{ref}$ 167. All phase signals $\Phi_i$ and $\Phi_{ref}$ 167 have the same period that is defined as $KT_{delay}$, such that a delay between each phase $\Phi_i$ is equal to $T_{delay}$. The reference phase $\Phi_{ref}$ 167 is skewed with respect to $\Phi_i$, such that no edge of $\Phi_i$ coincides with any edge of $\Phi_{ref}$ 167. The oscillator output control 170 dynamically selects a particular phase $\Phi_i$ by sending a phase select signal 172 to multiplexer 175 to generate a desired frequency at the rate of $\Phi_{ref}$ 167.

The following examples illustrate the purpose of the code word L and how it effects the operation of the frequency synthesizer 160 in DPLL 100. For the code word L equal to zero, then the selected phase would always be the same $\Phi_i$, thus the generated clock 180 period would be $KT_{delay}$. For the code word L equal to 1, then the phase selection in subsequent clock cycles would be $\Phi_i, \Phi_{i+1}, \Phi_{i+2}$, and so forth, resulting in a clock period of $(K+1)T_{delay}$. For the code word L equal to 2, then the phase selection in subsequent clock cycles would be $\Phi_i, \Phi_{i+2}, \Phi_{i+4}$, and so forth, resulting in a clock period of $(K+2)T_{delay}$.

When the last phase $\Phi_K$ is reached, the phase selection is disabled for the appropriate number of clock periods of $\Phi_{ref}$ to achieve the desired generated clock 180 period for $T_{gen}$. This technique is well-known in the literature and the detailed description here is merely to illustrate and formulate a transfer function for the frequency synthesizer 160, which is the following equation:

$$T_{gen} = (L + K) T_{delay} \quad [8].$$

Other preferred embodiments of a frequency synthesizer 160 have other transfer functions that are similar to equation [8] for the above embodiment. The preferred embodiment of the frequency synthesizer 160 as described above, is preferred over a single programmable frequency divider, because the oscillator output control 170 runs at a frequency $1/(KT_{delay})$ instead of $1/T_{delay}$. The transfer function of the single programmable frequency divider would be a special case of equation [8] with K=1.

Combining equations [1] and [8] a transfer function is realized, wherein $f_{gen}$ is proportional to a code word N, where N represents the sampled phase, and $T_{gen}$ is proportional to a code word L, as illustrated in the following equation:

$$f_{gen} = G_{osc} N = \frac{1}{T_{gen}} = \frac{1}{(L+K)T_{delay}}. \quad [9]$$

The range of the generated frequency $f_{gen}$ is scalable and depends on the following quantities:

$T_{delay}$ Time resolution of the oscillator, for example 250 ps per phase

K Number of phases provided by the oscillator, for example K=16

L Range of the code word, for example 0<L<256

The ratio between the maximum and the minimum value of $f_{gen}$ is (L+K)/K. With the numbers given in the example above, the frequency range extends from 15 MHz (=1/(256+16)/250 ps) to 250 MHz (=1/16/250 ps).

Next, a transcoder 150 of the oscillator transfer function 145 transforms the code word N into the code word L. Therefore, the transcoder 150 transfer function L(N) 157 is obtained by rewriting equation [9] as follows:

$$L(N) = \frac{1}{G_{osc}T_{delay}} \frac{1}{N} - K. \quad [10]$$

However, according to equation [7], $G_{osc}T_{ref}=1$ needs to be satisfied. By combining $G_{osc}T_{ref}=1$ with equation [10] the following equation is resulted:

$$L(N) = \frac{1}{G_{osc}T_{delay}} \frac{1}{N} - K = \frac{T_{ref}}{G_{osc}T_{ref}T_{delay}} \frac{1}{N} - K = \frac{T_{ref}}{T_{delay}} \frac{1}{N} - K. \quad [11]$$

To calculate L(N) according to equation [11], the parameter K and the ratio $T_{ref}/T_{delay}$ must be known. It is not necessary that the absolute values of $T_{ref}$ and $T_{delay}$ be known.

If the oscillator control word L is set to a known value $L_1$, the number of generated clock cycles $N_1$ during one reference period $T_{ref}$ is given by equation [3] and the output clock rate $f_{gen}$ for $L=L_1$ is given by equation [9]. Combining $L=L_1$ with the equations [3] and [9], the following equation is resulted:

$$N_1 = f_{gen}T_{ref} = \frac{T_{ref}}{(L_1+K)T_{delay}} \Rightarrow \frac{T_{ref}}{T_{delay}} = (L_1+K)N_1. \quad [12]$$

Then combining equations [11] and [12], the following equation is resulted:

$$L(N) = \frac{(L_1+K)N_1}{N} - K. \quad [13]$$

The transcoder 150 implements the oscillator transfer function 145 given in equation [13], where a digital multiplier and a digital divider are required. In one preferred embodiment, a lookup table is used to store precalculated values of 1/N, and an interpolation scheme is used to calculate 1/N for the intermediate values that are not stored in the lookup table. Also, a sequencer may be used to perform all operations involved in equation [13] (i.e., lookup 1/N, interpolate, multiply with $N_1$, multiply with $L_1+K$, subtract K) sequentially, using only one digital multiplier.

The parameter acquisition 125 uses the registers 135 and 140 to store the values $N_1$ and $L_1$, respectively. Where $L_1$ 141 is simply a set value of L during an arbitrary reference clock period and $N_1$ 136 is a measured value from counter 130 of the generated clock 180 cycle count during a reference clock (i.e., input clock 112) cycle period.

Initially, the DPLL 100 operates in a bypass mode, where the oscillator control word $L_{external}$ 158 and thus $L_1$ 141 is provided as an external input through the multiplexer 155. Provided the reference clock (i.e., input clock 112) period does not change, the acquired parameters $N_1$ 136 and $L_1$ 141 can be used indefinitely. However, the oscillator parameter may slowly change over time, due to temperature variations or other environmental variations. Therefore the parameters $N_1$ 136 and $L_1$ 141 are continuously monitored while the DPLL 100 is in a locked state. A calibration signal 151 is provided to feed updated parameters $N_1$ 136 and $L_1$ 141 to the transcoder 150 from time to time. If the parameters $N_1$ 136 and $L_1$ 141 are not updated, the DPLL 100 remains locked to the desired frequency, but a response to noise is less than optimal. The parameters $N_1$ 136 and $L_1$ 141 must be updated whenever the reference clock (i.e., input clock 112) frequency is intentionally changed to ensure optimal noise immunity. For example, in a video application a vertical retrace period can be used to trigger a periodic calibration in the locked mode for the DPLL 100, and a signaling for video mode change, can trigger an initial calibration signal to put the DPLL in a bypass mode.

One advantage of the present invention is that the DPLL 100 requires only a single analog component, which is a free running oscillator 165, where its frequency need not to be programmable, tunable or otherwise controllable. In an preferred embodiment the free running oscillator is the K-phase oscillator 165 and other preferred embodiments may have different K-phase oscillators. A deviation of as much as 50% off the nominal oscillator frequency can be tolerated without any noticeable impact on the overall performance of the design. Therefore, the present invention is very robust and insensitive to process or temperature variations.

All digital components used for a design of the present invention implement a unique algorithm that enables the DPLL 100 to lock within a single reference clock cycle. For example, in a video application, a line-locked DPLL 100 using an embodiment of the present invention generates a stable pixel clock after 1 line. In addition, the DPLL 100 of the present invention can maintain its acquired frequency for an indefinite period of time, even after synchronization is temporarily lost for a period of time.

The present invention requires only a few levels of logic switching at an application frequency (e.g., the pixel clock frequency of an HDTV system). Typically, most of the logic switches at a significantly lower frequency than that of the DPLL. Therefore, the DPLL can be represented as a technology-independent register-transfer-level (RTL) description and implemented with low effort in a variety of different process technologies.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. An auto-adaptive digital phase locked loop (DPLL) comprising:
   (a) a phase detector including:
      (i) an edge detector having an input that receives an input clock, and an output that outputs a reference event generated from a reference edge of the input clock,
      (ii) a programmable first counter that counts down at a generated clock rate, the first counter having a first input that is programmed with an integer value M, a second input that receives the generated clock, and an output that outputs a counter state based on the generated clock and the integer value M, and (iii) a first register having a first input that receives the reference event, a second input that receives the counter state, and an output that outputs a sample value N(t), wherein the register stores the counter state as the sampled value N(t) that represents a code for a phase between the reference event and the counter state; and (b) a frequency synthesizer coupled to the phase detector, the frequency synthesizer outputting, to at least the phase detector, the generated clock at a frequency proportional to the sample value N(t).

2. The auto-adaptive digital phase loop (DPLL) of claim 1, wherein the frequency synthesizer includes:

(i) a K-phase oscillator having a first output that outputs a phase reference $\Phi_{ref}$ signal, and a plurality of K second outputs that output K phase signals $\phi_K$, where K is a positive integer that is greater than one, (ii) an oscillator output control circuit having a first input that receives a transcoder transfer function L(N), a second input that receives the phase reference $\Phi_{ref}$ signal, and an output that outputs a phase select signal, and (iii) a multiplexer having a first input that receives the phase select signal, a second input that receives the K phase signals $\Phi_K$, and an output that outputs the generated clock according to the phase select signal.

3. The auto-adaptive digital phase locked loop (DPLL) of claim 2 further comprising:

(e) an oscillator transfer function circuit including:
(i) a transcoder having a first input that receives the sampled value N(t),
(ii) a second input that receives a measured value $N_1$,
(iii) a third input that receives a set value $L_1$,
(iv) a fourth input that receives a calibrate signal, and
(v) an output for outputting a calculated transfer function L(N).

4. The auto-adaptive digital phase locked loop (DPLL) of claim 3 wherein the oscillator transfer function circuit further includes:

(vi) a multiplexer having a first input that receives the calculated transfer function L(N),
(vii) a second input that receives an external value $L_{external}$,
(viii) a third input that receives a bypass signal, and
(ix) an output for outputting the calculated transfer function and the set value $L_1$.

5. The auto-adaptive digital phase-locked loop (DPLL) of claim 1 wherein the input clock has at least one selectable reference edge which may be selected to be a rising edge, a falling edge or both the rising and the falling edges.

6. The auto-adaptive digital phase-locked loop (DPLL) of claim 1 wherein the integer value M ranges from about 100 to about 5000.

7. An auto-adaptive digital phase locked loop (DPLL) comprising:

(a) a frequency synthesizer that outputs a generated clock including:
(i) a K-phase oscillator having a first output that outputs a phase reference $\Phi_{ref}$ signal, and a plurality of K second outputs that output K phase signals $\Phi_K$, where K is a positive integer that is greater than one,
(ii) an oscillator output control circuit having a first input that receives a transcoder transfer function L(N), a second input that receives the phase reference $\Phi_{ref}$ signal, and an output that outputs a phase select signal, and
(iii) a multiplexer having a first input that receives the phase select signal, a second input that receives the K phase signals $\Phi_K$, and an output that outputs the generated clock according to the phase select signal; and (b) a phase detector coupled to the frequency synthesizer, the phase detector determining a sample phase N(t) according to the generated clock signal and an input clock signal input to the phase detector, the phase detector applying an integer value M to the generated clock signal.

8. The auto-adaptive digital phase locked loop (DPLL) of claim 7 wherein the K-phase oscillator has a fixed divider with a K value that is a power of 2 (e.g., $2^x$, where x=0, 1, 2, 3, . . . ) for defining K phase signals.

9. The auto-adaptive digital phase-locked loop (DPLL) of claim 7 wherein the DPLL locks the generated clock to within a single reference clock period ($T_{ref}$).

10. The auto-adaptive digital phase-locked loop (DPLL) of claim 7 wherein the generated clock has a scalable frequency range.

11. A method of producing a generated clock frequency output for an auto-adaptive digital phase locked loop, the method comprising:

(a) inputting an input clock signal into a first input of an edge detector of a phase detector circuit that generates an output reference event;

(b) programming a first counter of the phase detector circuit into a first counter input with an integer value M and inputting the generated clock into a second input of the first counter, the first counter outputting a counter state;

(c) inputting the reference event into a first input and inputting the counter state into a second input of a first register of the phase detector circuit that outputs a sampled code N(t), where t denotes normalized time (t=time/$T_{ref}$);

(d) inputting the generated clock into a second counter of a parameter acquisition circuit that counts down and outputs a measured value $N_1$ at a predetermined interval;

(e) inputting the reference event and the measured value $N_1$ into a second register of the parameter acquisition circuit for storage and for outputting the measured value $N_1$ as needed;

(f) inputting a calculated value L(N) and the reference event into a third register of the parameter acquisition circuit for storage and outputting a set value $L_1$ as needed;

(g) inputting the sampled code N(t) into a first input, inputting the measured value $N_1$ into a second input, and inputting the set value $L_1$ into a third input of a transcoder that outputs a transfer function L(N) to a first multiplexer of an oscillator transfer function circuit;

(h) inputting a calculated value L(N) into a first input and inputting a reference phase signal $\Phi_{ref}$ into a second input of an oscillator output control circuit that outputs a phase select signal;

(i) inputting a plurality of K phase signals $\Phi_K$ generated by a free-running K-phase oscillator into a first input and inputting the phase select signal into a second input of a multiplexer of a frequency synthesizer circuit; and (j) selecting and outputting a phase signal $\Phi_i$ from the plurality of K phase output signals $\Phi_K$ by the multiplexer of the frequency synthesizer circuit from the K-phase oscillator by using the phase select signal generated by the oscillator output control wherein $\Phi_i$ is the generated clock frequency.

* * * * *